(12) United States Patent
Park et al.

(10) Patent No.: US 10,756,152 B2
(45) Date of Patent: Aug. 25, 2020

(54) DISPLAY DEVICE AND METHOD FOR MANUFACTURING THE SAME

(71) Applicant: Samsung Display Co., Ltd., Yongin-Si, Gyeonggi-Do (KR)

(72) Inventors: Jun Hong Park, Suwon-si (KR); Ji-Hyun Kim, Hwaseong-si (KR); Jun Chun, Hwaseong-si (KR); Eui Suk Jung, Seoul (KR); Jeong Min Park, Seoul (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/423,296

(22) Filed: May 28, 2019

(65) Prior Publication Data

US 2020/0105847 A1 Apr. 2, 2020

(30) Foreign Application Priority Data

Sep. 27, 2018 (KR) .......................... 10-2018-0114880

(51) Int. Cl.
*H01L 27/32* (2006.01)

(52) U.S. Cl.
CPC .... *H01L 27/3258* (2013.01); *H01L 2227/323* (2013.01)

(58) Field of Classification Search
CPC .... H01L 27/32; H01L 27/325; H01L 27/3258

USPC .......................................................... 257/40
See application file for complete search history.

(56) References Cited

U.S. PATENT DOCUMENTS

2019/0055444 A1* 2/2019 Fujiwara .................. C08K 3/38

FOREIGN PATENT DOCUMENTS

| JP | 4745266 B2 | 8/2011 |
|---|---|---|
| KR | 10-0599595 B1 | 7/2006 |
| KR | 10-0821959 B1 | 4/2008 |
| KR | 10-2015-0002468 A | 1/2015 |
| KR | 10-2018-0034777 A | 4/2018 |

* cited by examiner

*Primary Examiner* — Monica D Harrison
(74) *Attorney, Agent, or Firm* — Innovation Counsel LLP

(57) ABSTRACT

An exemplary embodiment of the present inventive concept provides a display device including: a substrate; a semiconductor layer; a first inorganic insulating film disposed on the semiconductor layer and including a first opening; a first conductive film disposed on the first inorganic insulating film; a second inorganic insulating film disposed on the first inorganic insulating film to fill a concave portion on the first conductive film; a second conductive film disposed on the second inorganic insulating film; a third inorganic insulating film disposed on the second conductive film and including a second opening; and a third conductive film disposed on the third inorganic insulating film, and connected to the second conductive film, wherein the first opening and the second opening may overlap each other.

20 Claims, 16 Drawing Sheets

DISPLAY DEVICE AND METHOD FOR MANUFACTURING THE SAME

CROSS-REFERENCE TO RELATED APPLICATION

This application claims priority to and the benefit of Korean Patent Application No. 10-2018-0114880 filed in the Korean Intellectual Property Office on Sep. 27, 2018, the entire contents of which are incorporated herein by reference.

BACKGROUND

(a) Technical Field

The present inventive concept relates to a display device and a method of manufacturing the same, and more particularly, to a display device including an opening and a method of manufacturing the same.

(b) Description of the Related Art

Display devices which are currently known include a liquid crystal display (LCD), a plasma display panel (PDP), an organic light emitting diode device (OLED device), a field effect display (FED), an electrophoretic display device, and the like. The display device may include a substrate and a plurality of thin film layers stacked on the substrate.

Recently, as resolution of a display panel increases, a size of one pixel becomes smaller, and a density of patterns forming a thin film layer increases.

The above information disclosed in this background section is only for enhancement of understanding of the background of the inventive concept, and therefore it may contain information that does not form the prior art that is already known in this country to a person of ordinary skill in the art.

SUMMARY

The present inventive concept has been made in an effort to provide a display device and a method of manufacturing the same that may improve stability and straightness of a subsequent layer by facilitating an overlapped alignment of upper and lower openings through filling of an inorganic film in the lower opening, reducing a size of the opening to reduce an area occupied by a pixel, and reducing a step between layers through planarization.

An exemplary embodiment of the present inventive concept provides a display device including: a substrate; a semiconductor layer disposed on the substrate; a first inorganic insulating film disposed on the semiconductor layer and including a first opening; a first conductive film disposed on the first inorganic insulating film, the first conductive film disposed on a lateral surface and a lower surface of the first opening; a second inorganic insulating film disposed on the first inorganic insulating film, the second inorganic insulating film filling a concave portion on the first conductive film; a second conductive film disposed on the second inorganic insulating film and connected to the first conductive film; a third inorganic insulating film disposed on the second conductive film and the second inorganic insulating film exposed by the second conductive film, the third inorganic insulating film including a second opening; and a third conductive film disposed on the third inorganic insulating film and connected to the second conductive film, wherein the first opening and the second opening overlap each other in a plan view.

A lower end portion of each of the first opening and the second opening may be narrower than an upper end portion thereof, and when a width of the lower end portion of the first opening is referred to as a first line width and a width of the lower end portion of the second opening is referred to as a second line width, the second line width may be larger than or equal to the first line width.

The first line width may be 1.3 um or less.

The first opening and the second opening may overlap so that a center of the first line width, a center of the second conductive film, and a center of the second line width are in a straight line.

The second inorganic insulating film may be planarized so that an upper surface of the second inorganic insulating film may coincide with an upper surface of the first conductive film formed on the second inorganic insulating film.

The second conductive film and the third conductive film may be in contact with each other in a predetermined area within a closed edge.

Another exemplary embodiment of the present inventive concept provides a display device including: a substrate; a semiconductor layer disposed on the substrate; a first inorganic insulating film disposed on the semiconductor layer and including a first opening; a first conductive film disposed on the first inorganic insulating layer, the first conductive film disposed on a lateral surface and a lower surface of the first opening; a second inorganic insulating film disposed on the first conductive film, the second inorganic insulating film filling a concave portion on the first conductive film, the second inorganic insulating film including a second opening; and a second conductive film disposed on the second inorganic insulating film, formed on a lateral surface and a lower surface of the second opening, and connected to the first conductive film, in a plan view.

A lower end portion of each of the first opening and the second opening may be narrower than an upper end portion thereof, and when a width of the lower end portion of the first opening is referred to as a first line width and a width of the lower end portion of the second opening is referred to as a second line width, the second line width may be larger than or equal to the first line width.

The first line width may be 1.3 um or less.

The first opening and the second opening may overlap so that a center of the first line width and a center of the second line width are in a straight line.

A contact region of the first conductive film and the second conductive film has a ring shape in a plan view.

Another exemplary embodiment of the present inventive concept provides a manufacturing method of a display device, including: forming a semiconductor layer on a substrate; forming an insulating film on the substrate and forming a first inorganic insulating film on the insulating film; forming a first opening exposing the semiconductor layer in the first inorganic insulating film; forming a first conductive film on a lateral surface and a lower surface of the first opening on the first inorganic insulating film; forming a second inorganic insulating film on the first inorganic insulating film and a concave portion formed on the first conductive film; planarizing the second inorganic insulating film to form an isolated filling portion which fills the concave portion on the first conductive film; forming a second conductive film on the planarized second inorganic insulating film; forming a third inorganic insulating film on the second conductive film and the second inorganic insulating film exposed by the second conductive film; forming a second opening that exposes the second conductive film in the third inorganic insulating film at a position overlapping the first opening in a plan view; and forming a third conductive film that is disposed on the third inorganic insulating film and is disposed on a lateral surface and a lower surface of the second opening.

In the planarizing of the second inorganic insulating film, an upper surface of the second inorganic insulating film may be planarized so that the upper surface of the second inorganic insulating film may coincide with an upper surface of the first conductive film formed on the first inorganic insulating film.

A lower end portion of each of the first opening and the second opening is narrower than an upper end portion thereof, and when a width of the lower end portion of the first opening is referred to as a first line width and a width of the lower end portion of the second opening is referred to as a second line width, the second line width may be larger than or equal to the first line width.

The first line width may be 1.3 um or less.

The first opening and the second opening may overlap so that a center of the first line width, a center of the second conductive film, and a center of the second line width may be in a straight line.

Another exemplary embodiment of the present inventive concept provides a manufacturing method of a display device, including: forming a semiconductor layer on a substrate; forming an insulating film on the substrate; forming a first inorganic insulating film on the insulating film; forming a first opening exposing the semiconductor layer in the first inorganic insulating film; forming a first conductive film on a lateral surface and a lower surface of the first opening on the first inorganic insulating film; forming a second inorganic insulating film on the first conductive film, on the first inorganic insulating film exposed by the first conductive film, and on the first conductive film to fill a concave portion formed on the first conductive film; partially planarizing an upper surface of the second inorganic insulating film; forming a second opening that exposes the first conductive film and the second inorganic insulating film filling the concave portion formed on the first conductive layer to overlap the first opening in a plan view; and forming a second conductive film that is disposed on the second inorganic insulating film and is disposed on a lateral surface and a lower surface of the second opening.

In the planarizing the upper surface of the second inorganic insulating film, an upper surface of the second inorganic insulating film may be planarized so that the upper surface of the second inorganic insulating film may be higher than an upper surface of the first conductive film formed on the first inorganic insulating film.

A lower end portion of each of the first opening and the second opening may be narrower than an upper end portion thereof, and when a width of the lower end portion of the first opening is referred to as a first line width and a width of the lower end portion of the second opening is referred to as a second line width, the second line width may be larger than or equal to the first line width.

The first line width may be 1.3 um or less.

According to the display device and the method of manufacturing the same according to the embodiment, it is possible to realize a target line width of an upper opening by filling the inside of a lower opening with an inorganic film, it is possible to reduce an area occupied by a pixel by enabling accurate overlapping of upper and lower openings. In addition, it is possible to reduce a step between layers by flattening an inorganic film, thereby improving stability and straightness of a subsequent layer to securing a margin in process and design.

DETAILED DESCRIPTION OF THE EMBODIMENTS

Figure 1:
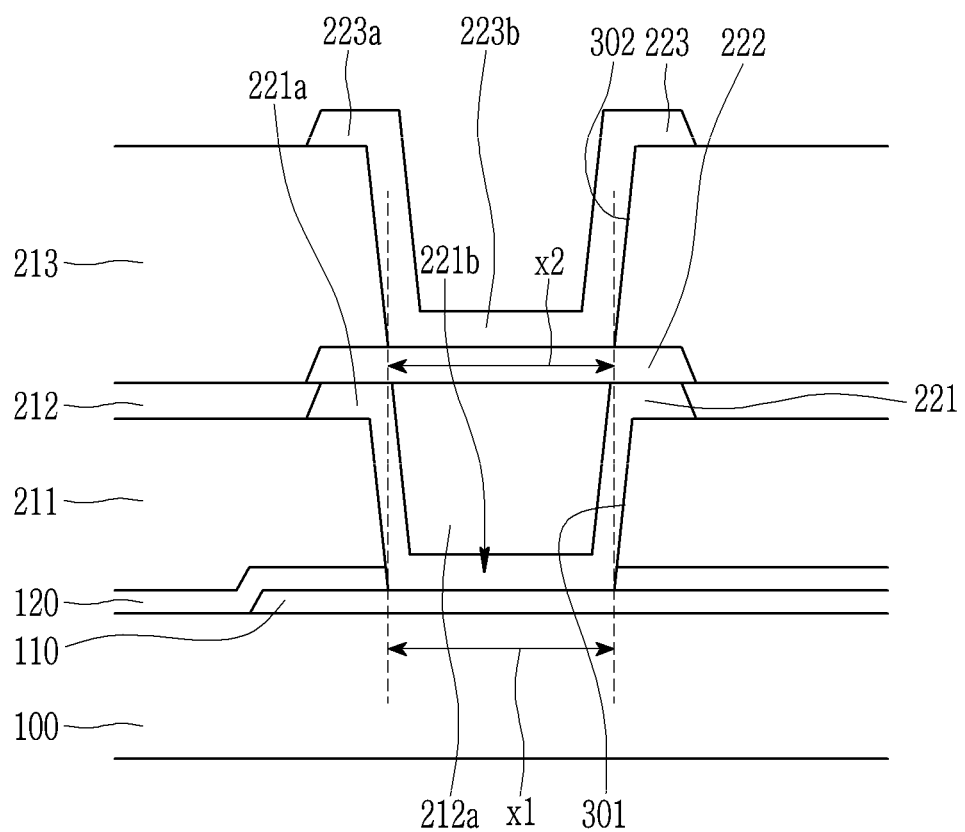
FIG. 1 illustrates a cross-sectional view of a display device according to an embodiment.

The present inventive concept will be described more fully hereinafter with reference to the accompanying drawings, in which exemplary embodiments of the inventive concept are shown. As those skilled in the art would realize, the described embodiments may be modified in various different ways, all without departing from the spirit or scope of the present disclosure.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, regions, etc., are exaggerated for clarity. In the drawings, for ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, an exemplary embodiment of the present inventive concept will be described in detail with reference to the accompanying drawings.

Figure 2:
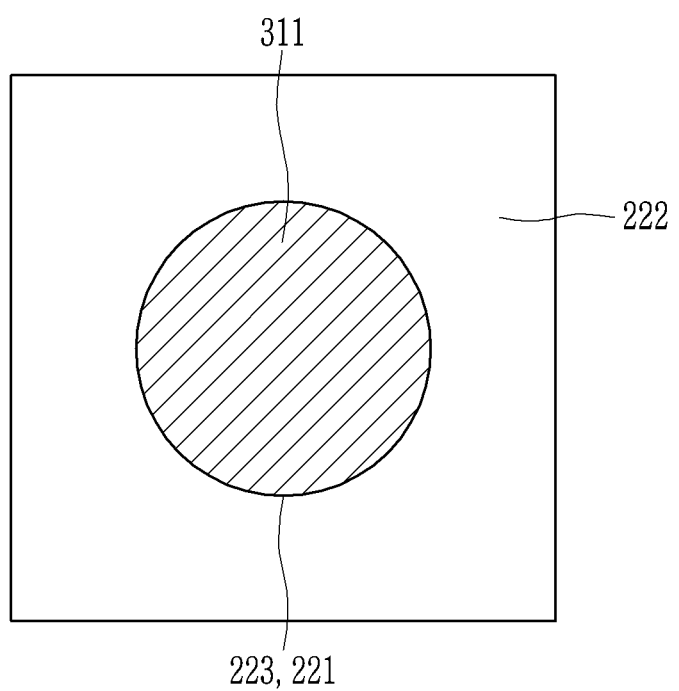
FIG. 2 illustrates a top plan view of the embodiment of FIG. 1.

Hereinafter, an opening overlapped portion according to an embodiment will be described with reference to FIG. 1 and FIG. 2. FIG. 1 illustrates a cross-sectional view of a display device according to an embodiment, and FIG. 2 illustrates a top plan view of the embodiment of FIG. 1.

Referring to FIG. 1, a display device according to an embodiment includes a substrate 100, a semiconductor layer 110, a gate insulating film 120, first to third inorganic insulating films 211, 212, and 213, and first to third conductive films 221 and 222, 223.

A buffer layer (not shown) may be included on the insulating substrate 100 made of transparent glass or plastic, and the buffer layer may be formed when the substrate 100 is plastic.

The semiconductor layer 110 may be disposed on the substrate 100. The semiconductor layer 110 may be formed as a polycrystalline silicon (poly-Si) layer or an oxide semiconductor layer. The oxide semiconductor may be at least one of an oxide based on titanium (Ti), hafnium (Hf), zirconium (Zr), aluminum (Al), tantalum (Ta), germanium (Ge), zinc (Zn), gallium (Ga), tin (Sn), or indium (In), and a complex oxide thereof. When the semiconductor layer 110 is formed of an oxide semiconductor, a separate protective layer (not shown) may be added to protect the oxide semiconductor, which is vulnerable to an external environment such as a high temperature.

In addition, the semiconductor layer 110 may include a channel region, and a source region and a drain region which are doped with n-type or p-type impurities on respective sides of the channel region.

The gate insulating film 120 may be disposed on the semiconductor layer 110. The gate insulating film 120 may include an inorganic insulating material such as a silicon nitride (SiNx) or a silicon oxide (SiOx). The insulating film may have a multilayer structure including at least two insulating films containing different materials. The insulating film may be a gate insulating film that insulates a gate electrode from the semiconductor layer 110.

The first inorganic insulating film 211 may be disposed on the gate insulating film 120. A first opening 301 exposing a portion of the semiconductor layer 110 is formed in the gate insulating film 120 and the first inorganic insulating film 211. A lower end portion of the first opening 301 may be narrower than an upper end portion thereof. In this case, the width of the lower end portion of the first opening 301 in a sectional view is referred to as a first line width x1. That is, the first opening 301 may expose the semiconductor layer 110 by the first line width x1. The first line width x1 is a fine size that may realize a resolution limit. The first line width x1 may be less than or equal to 1.5 μm, and may be, for example, less than or equal to 1.3 μm. In some embodiments, the gate insulating film 120 and the first inorganic insulating film 211 may be formed as a single layer.

The first conductive film 221 may be disposed on the upper portion of the first inorganic insulating film 211. The first conductive film 221 may contact the semiconductor layer 110 through the first opening 301. The first conductive film 221 may be a component of a circuit for transmitting a signal for driving a pixel of the display device according to the embodiment, and may be, for example, a source electrode or a drain electrode.

In this case, the first conductive film 221 may be formed on a lateral surface and a lower surface of the first opening 301. The first conductive film 221 may include a first portion 221a disposed on an upper portion of the first inorganic insulating film 211 and a second portion 221b disposed on the lateral surface and a lower surface of the first opening 301.

The second inorganic insulating film 212 may be disposed on the upper portion of the first inorganic insulating film 211 and fill a concave portion formed on the first conductive film 221 on the first opening 301. The second inorganic insulating film 212 may include a filling portion 212a filling the concave portion formed on the first conductive film 221. The filling portion 212a may be formed to fill the concave portion formed on the first conductive film 221 on the first opening 301 in which the second portion 221b of the first conductive film 221 is disposed. In this case, an upper surface of the second inorganic insulating film 212 may be planarized through a chemical-mechanical planarization (CMP) process so as to coincide with an upper surface of the first portion 221a of the first conductive film 221. That is, since the second inorganic insulating film 212 is formed of an inorganic material, when there is no planarization process therefor, a height of the upper surface of the second inorganic insulating film 212 is not uniform, thus wires to be deposited thereafter may not be uniformly arranged. However, when the planarization process is performed, the arrangement of the wires becomes uniform, so that a space occupied by the wires themselves may be reduced.

The second conductive film 222 may be disposed on the second inorganic insulating film 212 and the first portion 221a of the first conductive film 221. The second conductive film 222 may be formed to cover the filling portion 212a of the second inorganic insulating film 212 and the first portion 221a of the first conductive film 221. The second conductive film 222 may have a uniform height without a step, unlike the first conductive film 221. This is because the upper surface of the second inorganic insulating film 212 is planarized.

The third inorganic insulating film 213 may be disposed on the second inorganic insulating film 212 exposed by the second conductive film 222 and the second conductive film 222. A second opening 302 exposing a portion of the second conductive film 222 is formed in the third inorganic insulating film 213. Like the first opening 301, a lower end portion of the second opening 302 may be narrower than an upper end portion thereof. In this case, a width of the lower end portion of the second opening 302 in a sectional view is referred to as a second width. That is, the second opening 302 may expose the second conductive film 222 by the second line width x2. The second line width x2 may be greater than or equal to the first line width x1, which is a target line width of the second opening 302. The second line width x2 may be less than or equal to 1.5 μm, and may be, for example, less than or equal to 1.3 μm.

In this case, an upper surface of the third inorganic insulating film 213 may also be planarized through the planarization process, so that an interlayer step may be reduced.

The third conductive film 223 may be disposed on the third inorganic insulating film 213. The third conductive film 223 may contact the second conductive film 222 through the second opening 302. The third conductive film 223 may be a component of a circuit for transmitting a signal for driving a pixel of the display device according to the embodiment, and may be, for example, a data line or a data electrode for transmitting a data signal.

In this case, the third conductive film 223 may be formed on a lateral surface and a lower surface of the second opening 302. The third conductive film 223 may include a third portion 223a disposed on an upper portion of the third inorganic insulating film 213 and a fourth portion 223b disposed on a lateral surface and a lower surface of the second opening 302.

According to the present embodiment, the first opening 301 and the second opening 302 may vertically overlap each other with the second conductive film 222 disposed therebetween. In this case, the first conductive film 221 and the third conductive film 223 are formed on the lateral surface and the lower surface of each of the first opening 301 and the second opening 302, respectively. That is, the third conductive film 223 may be electrically connected to the semiconductor layer 110 which is in contact with the first conductive film 221 through the second conductive film 222.

The first to third inorganic insulating films 211, 212, and 213 may include an inorganic insulating material such as a silicon nitride (SiNx) or a silicon oxide (SiOx).

When the inside of the opening is filled with an organic film rather than an inorganic film, since the organic film has fluidity, it is difficult to neatly fill the surface like an inorganic film. In addition, it is difficult to control a height thereof during an organic layer forming process, thus planarization is also not easy. Accordingly, in the present inventive concept, the inside of the opening (the first opening 301 in the present embodiment) that is disposed at a lower portion is filled with the inorganic film such that the upper opening may be formed in a finer size.

Referring to FIG. 2, a first contact surface 311 between the first to third conductive films 221, 222, and 223 is shown.

The third conductive film 223 may contact the second conductive film 222 disposed therebelow in an area contact manner in which they contact each other with a predetermined area of an entire inside of a closed edge. As disclosed in FIG. 2, since a circumference of the third conductive film 223 forming the first contact surface 311 coincides with a circumference of the first conductive film 221 forming the first contact surface 311, it is shown that the first and second openings 301 and 302 completely overlap each other. However, the circumference of the third conductive film 223 forming the first contact surface 311 may be larger than that of the first conductive film 221. The first contact surface 311 is shown as a circle in the present embodiment, but the present inventive concept is not limited thereto.

Although not shown, the display device according to the present embodiment may further include a passivation film 180, a partition wall 350, and an organic light emitting diode (OLED) stacked on the third conductive film 223.

Hereinafter, a method of manufacturing the display device according to the embodiment will be sequentially described with reference to FIG. 3 to FIG. 7 and FIG. 1. FIG. 3 to FIG. 7 illustrate cross-sectional views for explaining a method of manufacturing the display device according to the embodiment of FIG. 1.

Figure 3:
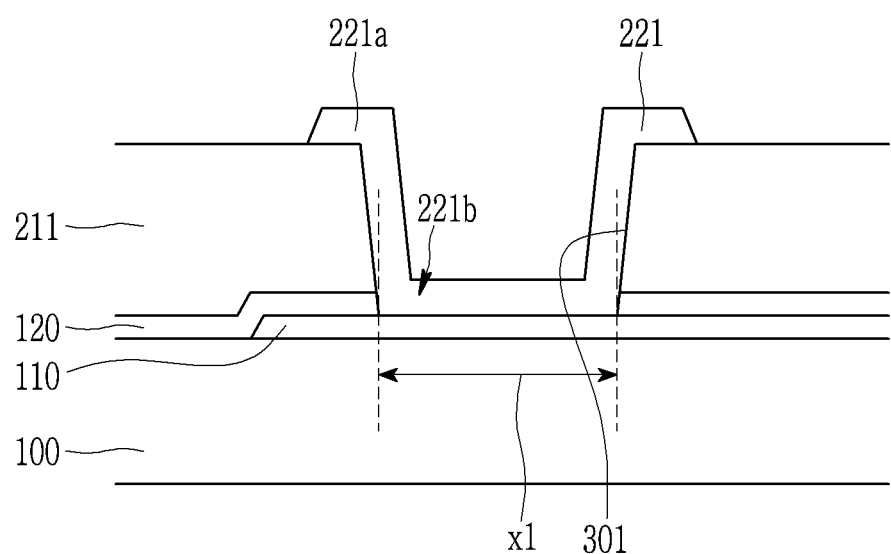
FIG. 3 to FIG. 7 illustrate cross-sectional views for explaining a method of manufacturing the display device according to the embodiment of FIG. 1.

Referring to FIG. 3, the substrate 100 may be prepared, and a buffer layer (not shown) may be formed. The semiconductor layer 110 is formed on the substrate 100, and then the gate insulating film 120 and the first inorganic insulating film 211 are sequentially formed thereon.

The first opening 301 is formed to penetrate the gate insulating film 120 and the first inorganic insulating film 211 and to exposes a portion of the semiconductor layer 110 by performing an etching process using a pattern mask. A lower end portion of the first opening 301 may be narrower than an upper end portion thereof. When the width of the lower end portion of the first opening 301 in a sectional view is the first line width x1, the lower end portion of the first opening 301 may be formed so that the first line width x1 may be 1.5 µm or less.

Next, the first conductive film 221 is formed on the upper surface of the first inorganic insulating film 211 and the lateral surface and the lower surface of the first opening 301. The first conductive film 221 includes the first portion 221a disposed on the upper portion of the first inorganic insulating film 211 and the second portion 221b disposed on the lateral surface and a lower surface of the first opening 301. The first conductive film 221 may be directly connected to the semiconductor layer 110 through the first opening 301.

Figure 4:
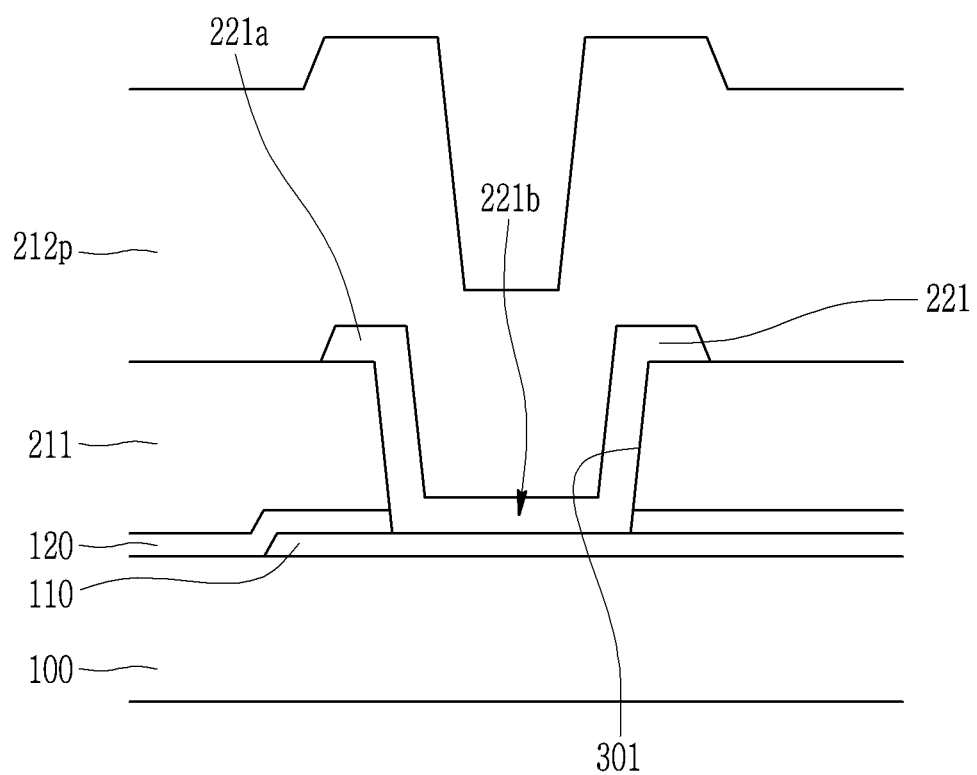

Referring to FIG. 4, a second inorganic insulating film 212p is formed on the first inorganic insulating film 211 and the first conductive film 221. The second inorganic insulating film 212p is formed so as to fill a concave portion formed on the first conductive film 221. In this case, a step may be formed in the second inorganic insulating film 212p due to the concave portion formed on the first conductive film 221.

Figure 5:
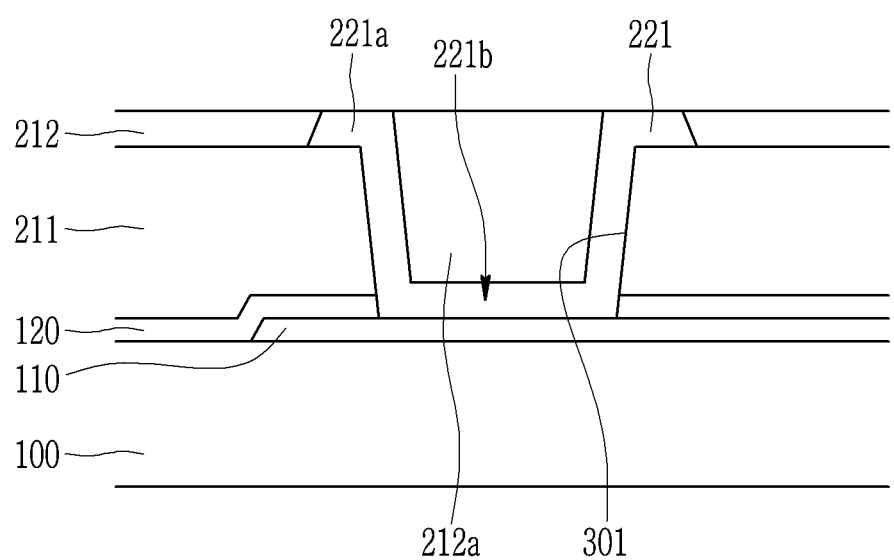

Referring to FIG. 5, the second inorganic insulating film 212p formed in FIG. 4 is planarized through a planarization process to complete the second inorganic insulating film 212 including the filling portion 212a. The filling portion 212a is a portion which fills the concave portion formed on the first conductive film 221. That is, when a planarization process such as a chemical-mechanical polishing (CMP) process is performed using the first conductive film 221 as an etching stopper, the filling portion 212a having a same height with the first conductive film 221 is formed. That is, as a result of planarization, the second inorganic insulating film 212 may be formed so that the upper surface of the first portion 221a of the first conductive film 221 and the upper surface of the second inorganic insulating film 212 coincide with each other. The filling portion 212a is formed of the same material as the second inorganic insulating film 212.

Figure 6:
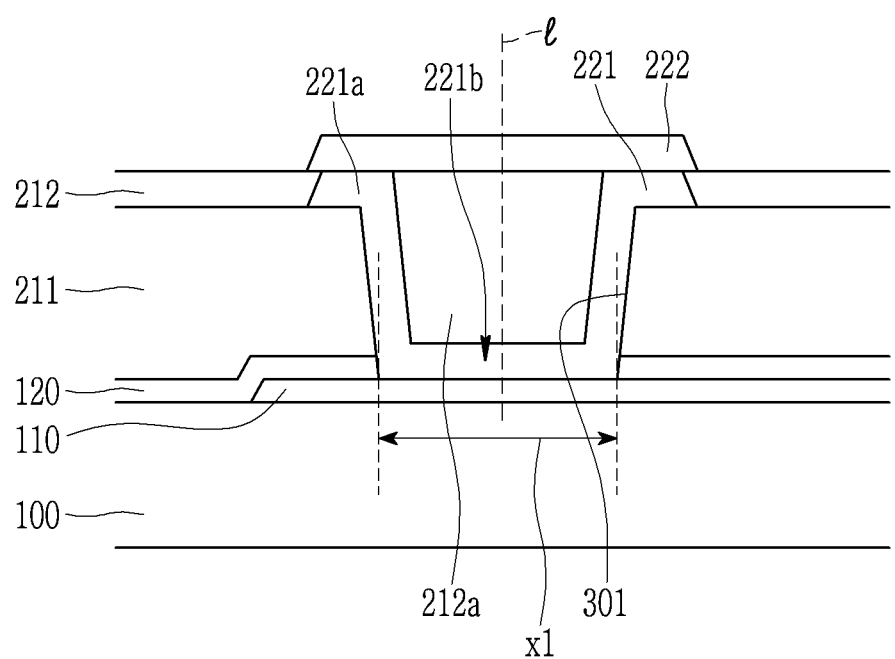

Referring to FIG. 6, the second conductive film 222 is formed on the second inorganic insulating film 212 and the first portion 221a of the first conductive film 221. The second conductive film 222 may be formed to cover the filling portion 212a of the second inorganic insulating film 212 and the first portion 221a of the first conductive film 221.

Since the upper surface of the second inorganic insulating film 212 is planarized, the second conductive film 222 may have a constant height without a step, unlike the first conductive film 221.

In the sectional view of FIG. 6, the second conductive film 222 may be formed so that a center of the second conductive film 222 and a center of the first line width x1 of the first opening 301 may be on a straight line 1.

Figure 7:
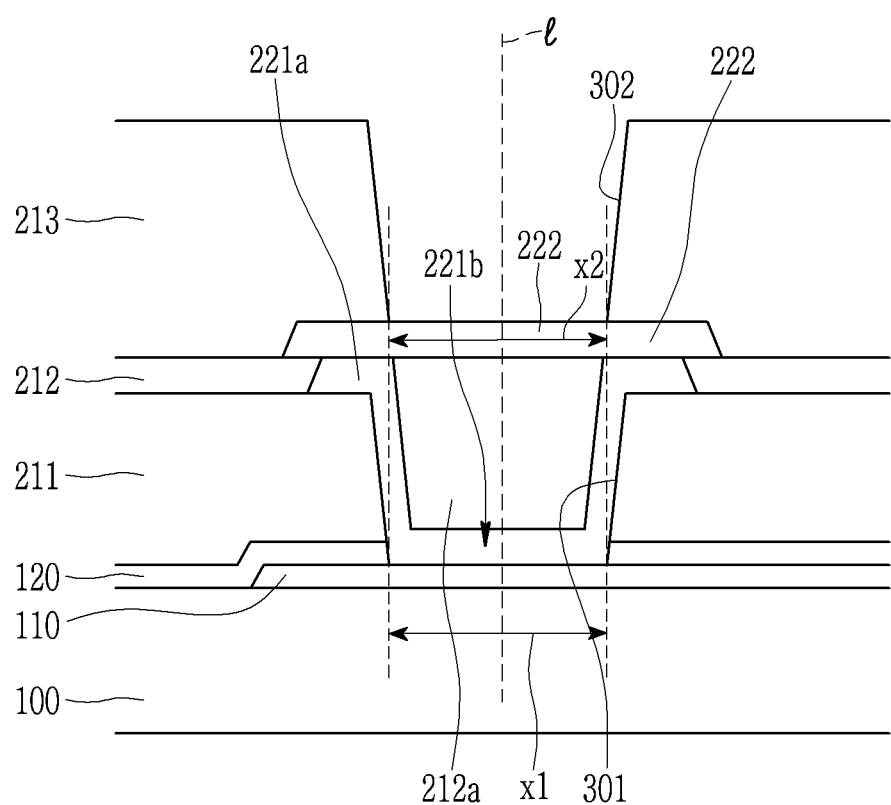

Referring to FIG. 7, the third inorganic insulating film 213 may be formed to cover the second inorganic insulating film 212 and the second conductive film 222. Next, the second opening 302 is formed to penetrate the third inorganic insulating film 213 through the etching process using the pattern mask and to expose a portion of the second conductive film 222. The pattern mask used to form the second opening 302 may be the same mask as the pattern mask used to form the first opening 301. The lower end portion of the second opening 302 may be narrower than the upper end portion thereof.

In this case, when the width of the lower end portion of the second opening 302 in a sectional view is the second line width x2, the lower end portion of the second opening 302 may be formed so that the second line width x2 may be 1.5 µm or less. The second line width x2 may be equal to or greater than the first line width x1.

In addition, a center of the first line width x1, a center of the second conductive film 222, and a center of the second line width x2 may be formed so as to be on the straight line 1. That is, the upper and lower openings, which are the first and second openings 301 and 302 in this embodiment, may be formed so as to exactly and vertically overlap each other.

Next, referring again to FIG. 1, the third conductive film 223 is formed on the lateral surface and the lower surface of the second opening on the third inorganic insulating film 213. The third conductive film 223 includes the third portion 223a disposed on the upper portion of the third inorganic insulating film 213 and the fourth portion 223b disposed on a lateral surface and a lower surface of the second opening 302. The third conductive film 223 may be directly connected to the second conductive film 222 through the second opening 302 to be electrically connected to the semiconductor layer 110 contacting the first conductive film 221 through the second conductive film 222.

On the other hand, by planarizing the upper surface of the third inorganic insulating film 213 by a planarization process, it is possible to facilitate the overlapping between the openings described above by reducing the interlayer step and to ensure the stability of the pattern of the subsequent layer and the stability of the light passing through the substrate 100.

Figure 8:
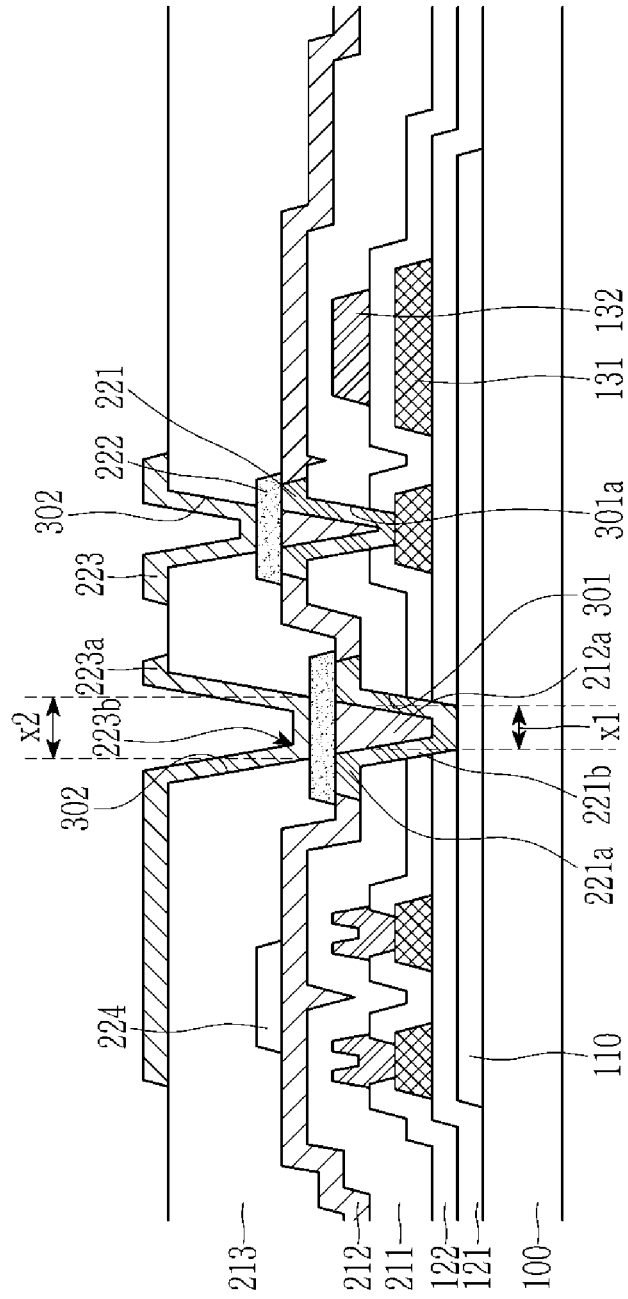
FIG. 8 illustrates a cross-sectional view of a display device according to an embodiment.

Hereinafter, a display device according to an embodiment will be described with reference to FIG. 8. FIG. 8 illustrates a cross-sectional view of the display device to which the embodiment of FIG. 1 is applied.

In the embodiment of FIG. 8, since a second gate insulating film 122, a first gate electrode 131, a storage electrode 132, and a second storage electrode 224 are added, there is a difference at the lower portion in which the first opening 301 is formed. Hereinafter, features different from those of FIG. 1 and the elements added to those of FIG. 1 will be mainly described. Components that are not described are the same as the embodiment described above, and elements and methods that are the same as in the above-described embodiment will have the same reference numerals.

Referring to FIG. 8, a display device according to an embodiment includes the substrate 100, the first and second gate insulating films 121 and 122, the semiconductor layer 110, the first to third inorganic insulating films 211, 212, and 213, and the first to fourth conductive films 221, 222, 223, and 224.

The semiconductor layer 110 may be disposed on the insulating substrate 100. Although not shown, the semiconductor layer 110 may include a channel region, and a source region and a drain region on respective sides of the channel region.

The first gate insulating film 121 may be disposed on the semiconductor layer 110, and the first gate electrode 131 may be disposed on the first gate insulating film 121. The first gate electrode 131 may overlap the channel region of the semiconductor layer 110.

The second gate insulating film 122 for protecting the first gate electrode 131 may be disposed on the first gate electrode 131.

The storage electrode 132 may be disposed on the second gate insulating film 122. The storage electrode 132 may be electrically insulated from the first gate electrode 131 by the second gate insulating film 122 interposed therebetween.

The first inorganic insulating film 211 may be disposed on the storage electrode 132.

The first opening 301 is formed in the first gate insulating film 121, the second gate insulating film 122, and the first inorganic insulating film 211 to expose a portion of the semiconductor layer 110. Since the first opening 301 has the first line width x1 at the lower end portion, the first opening 301 may expose the semiconductor layer 110 by the first line width x1. The first line width x1 may be less than or equal to 1.5 μm, and may be, for example, less than or equal to 1.3 μm.

In addition, a 1a-th opening 301a penetrating the second gate insulating film 122 and the first inorganic insulating film 211 may be formed at the same time when the first opening 301 is formed. In this case, the 1a-th opening 301a may expose a portion of the first gate electrode 131 at the lower end portion.

However, the components that the first opening 301 and the 1a-th opening 301a expose are not limited to the semiconductor layer 110 or the first gate electrode 131.

The first conductive film 221 may be disposed on the upper portion of the first inorganic insulating film 211. The first conductive film 221 may be formed on the lateral surface and the lower surface of the first opening 301 and the 1a-th opening 301a. The first conductive film 221 may include the first portion 221a disposed on the upper portion of the first inorganic insulating film 211 and the second portion 221b disposed on the lateral surface and the lower surface of the first opening 301 and the 1a-th opening 301a.

The second inorganic insulating film 212 may be disposed on the upper portion of the first inorganic insulating film 211 and a concave portion of the first conductive film 221. The second inorganic insulating film 212 may include a filling portion 212a filling the concave portion of first conductive film 221. The filling portion 212a may be formed to fill the concave portion of the first and 1a-th openings in which the second portion 221b of the first conductive film 221 is disposed.

In this case, the upper surface of the second inorganic insulating film 212 may be planarized through a planarization process so as to coincide with the upper surface of the first portion 221a of the first conductive film 221.

The second conductive film 222 may be disposed on the second inorganic insulating film 212 and the first portion 221a of the first conductive film 221. The second conductive film 222 may be formed to cover the filling portion 212a of the second inorganic insulating film 212 and the first portion 221a of the first conductive film 221. In this case, because the upper surface of the second inorganic insulating film 212 is planarized, the second conductive film 222 may have a uniform height without a step, unlike the first conductive film 221.

On the other hand, the second storage electrode 224 may be disposed on the second inorganic insulating film 212. The second storage electrode 224 may be a component of a circuit for transmitting a signal for driving a pixel of the display device according to the embodiment, and may be, for example, a data line or a data electrode for transmitting a data signal.

The third inorganic insulating film 213 may be disposed on the second conductive film 222, the second inorganic insulating film 212 exposed by the second conductive film 222, and the second storage electrode 224. The second opening 302 exposing a portion of the second conductive film 222 is formed in the third inorganic insulating film 213. Because the second opening 302 has the second line width x2 at the lower end portion, the second opening 302 may expose the second conductive film 222 by the second line width x2. The second line width x2 may be less than or equal to 1.5 μm, and may be, for example, less than or equal to 1.3 μm.

In this case, the upper surface of the third inorganic insulating film 213 may be planarized through the planarization process, so that an interlayer step may be reduced.

The third conductive film 223 may be disposed on the planarized third inorganic insulating film 213. The third conductive film 223 may contact the second conductive film 222 through the second opening 302.

In this case, the third conductive film 223 may be formed on the lateral surface and the lower surface of the second opening 302. The third conductive film 223 may include the third portion 223a disposed on the upper portion of the third inorganic insulating film 213 and the fourth portion 223b disposed on the lateral surface and the lower surface of the second opening.

According to the present embodiment, the first opening 301 and the second opening 302 may vertically overlap each other with the second conductive film 222 disposed therebetween. In this case, the first conductive film 221 and the third conductive film 223 are formed on the lateral surface and the lower surface of each of the first opening 301 and the second opening 302, respectively. That is, the third conductive film 223 may be electrically connected to the semiconductor layer 110 which is in contact with the first conductive film 221 through the second conductive film 222.

Alternatively, the third conductive film 223 may be electrically connected to the first gate electrode 131 that contacts the first conductive film 221 through the second conductive film 222.

Although not shown, the display device according to the present embodiment may further include a passivation film, a partition wall, and an organic light emitting diode (OLED) stacked on the third conductive film 223 described above.

Alignment of various patterns that are vertically stacked in a process of forming a pattern of a display device is important. Particularly, in order to increase a resolution, a density of patterns in a predetermined area increases, resulting in a decrease in a size of each pixel. In this case, it is necessary that openings having a target line width for realizing a resolution limit are formed to overlap each other. However, when the openings of a fine size overlap each other, it may be difficult to realize the target line width.

In the embodiment of the present inventive concept, the second inorganic insulating film 212 fills the inside of the first opening 301, so that the second conductive film 222 and the second opening 302 may easily overlap on the first opening 301. When the first and second openings 301 and 302 are formed to overlap each other, an aperture ratio may be improved by minimizing a non-opening area in which no image is displayed due to openings, compared with a structure in which openings do not overlap each other. Accordingly, a high-resolution display device in which a size of one pixel is relatively small may be realized.

Specifically, the center of the second conductive film 222 and the center of the first line width x1 may be aligned on the straight line. Accordingly, the second opening 302 formed on the second conductive film 222 may also be aligned so that the center of the second line width x2 and the center of the first line width x1 may be aligned on the straight line. That is, it is possible to facilitate the alignment of the openings that are overlapped when forming the pattern on the substrate 100, and further, it is possible to stably form the third conductive film 223 on the lateral and lower surfaces of the second opening 302.

In addition, because the first line width x1 of the first opening 301 is smaller than or equal to the second line width x2 of the second opening 302, and the first and second line widths x1 and x2 may be 1.3 μm or less for realizing the resolution limit, it is possible to minimize the non-opening area in which the image is not displayed due to the openings.

On the other hand, since the second inorganic insulating film 212 not only fills the inside of the first opening 301 but also the second inorganic insulating film 212 is planarized to be able to reduce the interlayer step, the second conductive film 222 may be flatly formed on the second inorganic insulating film 212 and the first conductive film 221 as compared with a structure that is not planarized. Accordingly, an area in which the third conductive film 223 contacts the second conductive film 222 through the second opening 302 overlapping the first opening 301 may be ensured. That is, the area of the first contact surface may be widened, thereby effectively transmitting a signal.

In addition, by reducing the interlayer step through the planarization process, when a plurality of thin film layers overlap each other in the high-resolution display device, the stability of the pattern of the subsequent layer and the uniformity of the process dispersion may be improved, and the straightness of the light passing through the substrate 100 may be improved.

Figure 9:
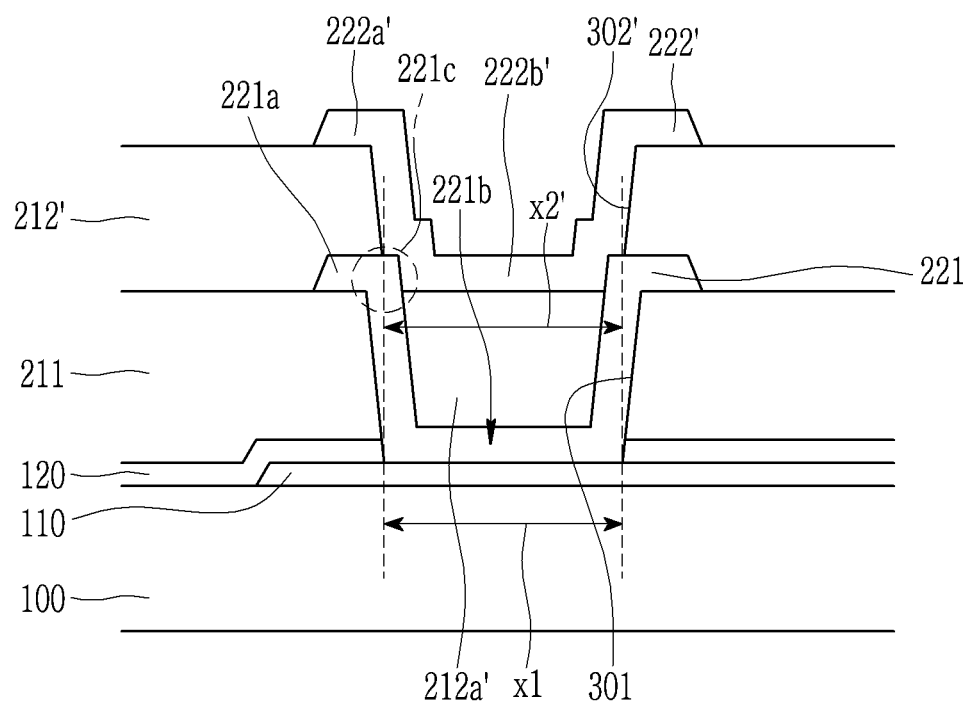
FIG. 9 illustrates a cross-sectional view of a display device according to an embodiment.
Figure 10:
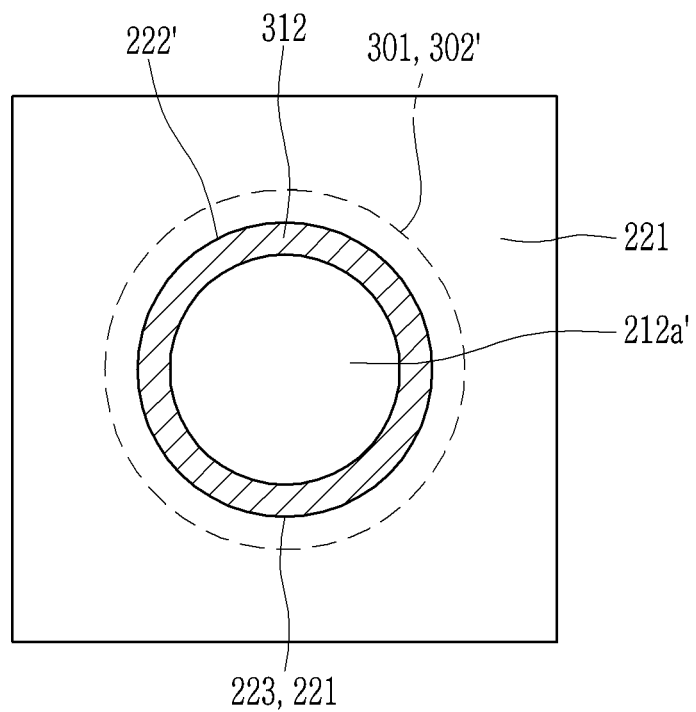
FIG. 10 illustrates a top plan view of the embodiment of FIG. 9.

Hereinafter, an opening overlapped portion according to an embodiment will be described with reference to FIG. 9 and FIG. 10. FIG. 9 illustrates a cross-sectional view of a display device according to an embodiment, and FIG. 10 illustrates a top plan view of the embodiment of FIG. 9.

Hereinafter, features that are different from the above-described embodiment will be mainly described, and features that are not described follow the above-described exemplary embodiment. For better comprehension and ease of description, elements and methods that are the same as in the above-described embodiment will have the same reference numerals.

Referring to FIG. 9, a display device according to an embodiment includes the substrate 100, the semiconductor layer 110, the gate insulating film 120, the first inorganic insulating film 211, a second inorganic insulating film 212', the first conductive film 221, and a second conductive film 222'.

The semiconductor layer 110 may be disposed on the insulating substrate 100. The gate insulating film 120 may be disposed on the semiconductor layer 110, and the first inorganic insulating film 211 may be disposed on the gate insulating film 120.

The first opening 301 exposing a portion of the semiconductor layer 110 is formed in the gate insulating film 120 and the first inorganic insulating film 211. A lower end portion of the first opening 301 may be narrower than an upper end portion thereof, and a width of the lower end portion is referred to as the first line width x1. That is, the first opening 301 may expose the semiconductor layer 110 by the first line width x1. The first line width x1 may be a fine size capable of realizing a resolution limit, and may be 1.5 μm or less, for example, 1.3 μm or less. In some embodiments, the gate insulating film 120 and the first inorganic insulating film 211 may be formed as a single layer.

The first conductive film 221 may be disposed on the upper portion of the first inorganic insulating film 211. The first conductive film 221 may contact the semiconductor layer 110 through the first opening 301. In this case, the first conductive film 221 may be formed on a lateral surface and a lower surface of the first opening 301. The first conductive film 221 includes the first portion 221a disposed on the upper portion of the first inorganic insulating film 211, the second portion 221b disposed on the lateral surface and the lower surface of the first opening 301, and the third portion

221c that is a connecting portion connecting the first portion 221a and the second portion 221b.

The second inorganic insulating film 212' may be disposed on the first conductive film 221, on the first inorganic insulating film 211 exposed by the first conductive film 221, and a concave portion of the first conductive film 221. The second inorganic insulating film 212' may include a filling portion 212a' filling the concave portion of the first conductive film 221. The filling portion may be formed to fill the concave portion of the first conductive film 221. In this case, the upper surface of the second inorganic insulating film 212 and an upper surface of the filling portion 212a' may be planarized through a planarization process. That is, because the second inorganic insulating film 212' is formed of an inorganic material, when there is no planarization process therefor, a height of the upper surface of the second inorganic insulating film 212' is not uniform, thus wires to be deposited thereafter may not be uniformly arranged. However, when the planarization process is performed, the arrangement of the wires becomes uniform, so that a space occupied by the wires themselves may be reduced.

A second opening 302' exposing the third portion 221c of the first conductive film 221 is formed in the second inorganic insulating film 212'. Like the first opening 301, a lower end portion of the second opening 302' may be narrower than an upper end portion thereof, and a width of the lower end portion is referred to as a second line width x2'. The second line width x2' may be greater than or equal to the first line width x1, which is a target line width of the second opening 302'. The second line width x2' may be less than or equal to 1.5 µm, and may be, for example, less than or equal to 1.3 µm.

The second conductive film 222' may be disposed on the first inorganic insulating film 212'. The second conductive film 222' may be formed to cover the filling portion 212a' of the second inorganic insulating film 212' and to contact the third portion 221c of the first conductive film 221. The second conductive film 222' may contact the first conductive film 221 through the second opening 302'. In this case, in the process of forming the second opening 302' so as to expose a third portion 221c of the first conductive film 221, because the second inorganic insulating film 212' is planarized to reduce the step, the inorganic insulating films 211 and 212' therearound may be prevented from being damaged.

The second conductive film 222' may be a component of a circuit for transmitting a signal for driving a pixel of the display device according to the embodiment, and may be, for example, a data line or a data electrode for transmitting a data signal.

In this case, the second conductive film 222' may be formed on the lateral surface and the lower surface of the second opening 302'. The second conductive film 222' may include a fifth portion 222a' disposed on the upper portion of the second inorganic insulating film 212' and a sixth portion 222b' disposed on the lateral surface and the lower surface of the second opening 302'.

According to the present embodiment, the first opening 301 and the second opening 302' may vertically overlap. In this case, the first conductive film 221 and the second conductive film 222' are formed on the lateral surface and the lower surface of each of the first opening 301 and the second opening 302'. That is, the second conductive film 222' may be electrically connected to the semiconductor layer 110 that contacts the first conductive film 221 by contacting a portion (the third portion 221c in the present embodiment) of the first conductive film 221 through the second opening 302'.

Referring to FIG. 10, a second contact surface 312 is shown between the first conductive film 221, the second conductive film 222', and the filling portion 212a' of the second inorganic insulating film 212'.

The second conductive film 222' may make ring contact with the first conductive film 221 disposed under the second conductive film 222' only in contact with an edge portion of a predetermined area. Specifically, it is shown that in a state in which the first conductive film 221 is disposed, a circumference of the first opening 301 and a circumference of the second opening 302' coincide with each other such that the first and second openings 301 and 302' vertically and completely overlap. The circumference of the filling portion 212a' of the first inorganic insulating film 212 may be disposed inside circumferences of the openings. Accordingly, the second conductive film 222' and the first conductive film 221 may make ring contact by an area excluding the area occupied by the filling portion 212a'.

In the present embodiment, a contact surface 312 between the first conductive film 221 and the second conductive film 222' is shown as a circle, but the present inventive concept is not limited thereto.

Although not shown, the display device according to the present embodiment may further include a passivation film, a partition wall, and an organic light emitting diode stacked on the second conductive film 222' described above.

Hereinafter, a comparison of the embodiment of FIG. 1 and the embodiment of FIG. 9 will be described.

First, in FIG. 1, the second inorganic insulating film 212 filling the first opening 301 and the third inorganic insulating film 213 penetrated by the second opening 302 may be formed of different layers. That is, the third inorganic insulating film 213 may be made of a different material from that of the second inorganic insulating film 212. However, the third inorganic insulating film 213 may be made of the same material as the first inorganic insulating film 211.

In contrast, in FIG. 9, the inorganic insulating film 212a' filling the first opening 301 and the inorganic insulating film 212' penetrated by the second opening 302' may be formed of the same layer as the second inorganic insulating film 212'.

In addition, according to the embodiment of FIG. 1, the second conductive film 222 is additionally disposed between the first conductive film 221 and the third conductive film 223. The second conductive film 222 may be disposed on the inorganic film that flatly fills the first opening 301 at the lower portion, thus it may be more advantageous for the alignment of the upper and lower openings and the overlay of the patterns than when the second conductive film 222 is not present.

That is, when a plurality of thin film layer patterns are formed on the substrate 100, the contact area may be reduced due to misalignment of the mask. In this case, the embodiment of FIG. 1, which makes the area contact instead of the ring contact, may be advantageous.

Hereinafter, a method of manufacturing a display device according to an embodiment will be sequentially described with reference to FIGS. 3, 4, 11 to 14, and 9. FIG. 11 to FIG. 14 illustrate cross-sectional views for explaining a method of manufacturing the display device according to the embodiment of FIG. 9.

Hereinafter, features that are different from the embodiment of FIG. 3 to FIG. 7 described above will be mainly described, and features that are not described follow the above-described exemplary embodiment. For better comprehension and ease of description, elements and methods that are the same as in the above-described embodiment will have the same reference numerals.

Figure 11:
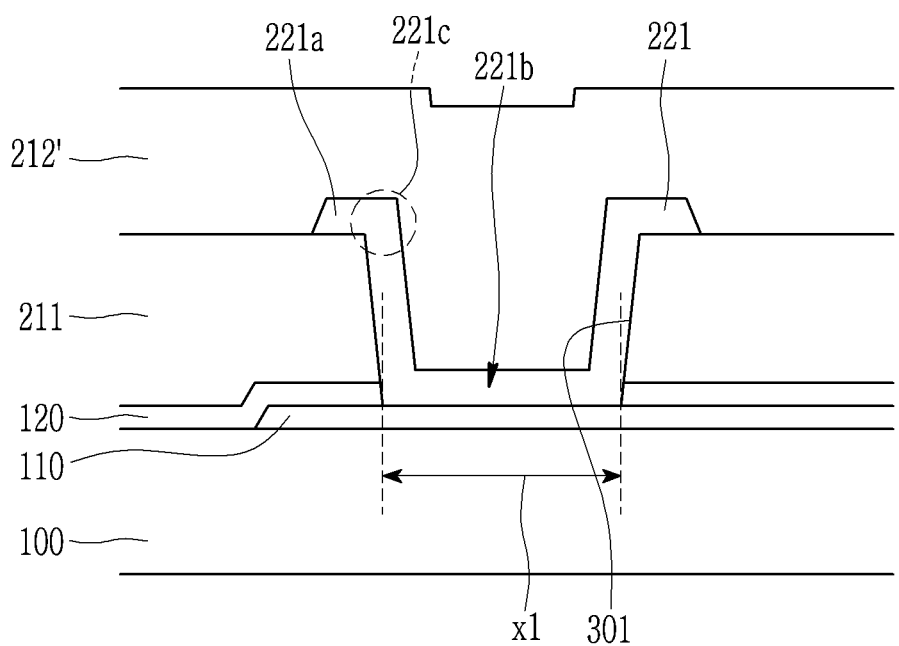
FIG. 11 to FIG. 14 illustrate cross-sectional views for explaining a method of manufacturing the display device according to the embodiment of FIG. 2.

The previous processes of FIG. 11 may be applied in the same manner as the contents of the embodiment of FIG. 3 and FIG. 4.

Referring to FIG. 11, the second inorganic insulating film 212p formed in FIG. 4 may be planarized by a planarization process to form the second inorganic insulating film 212' having a reduced step. In the present embodiment, unlike the embodiment of FIG. 5 described above, the second inorganic insulating film 212p may be planarized so that some of the second inorganic insulating film 212p remains on the first portion 221a of the first conductive film 221. However, the second inorganic insulating film 212 may be formed so that the upper surface of the first portion 221a of the first conductive film 221 and the upper surface of the second inorganic insulating film 212 coincide with each other.

Figure 13:
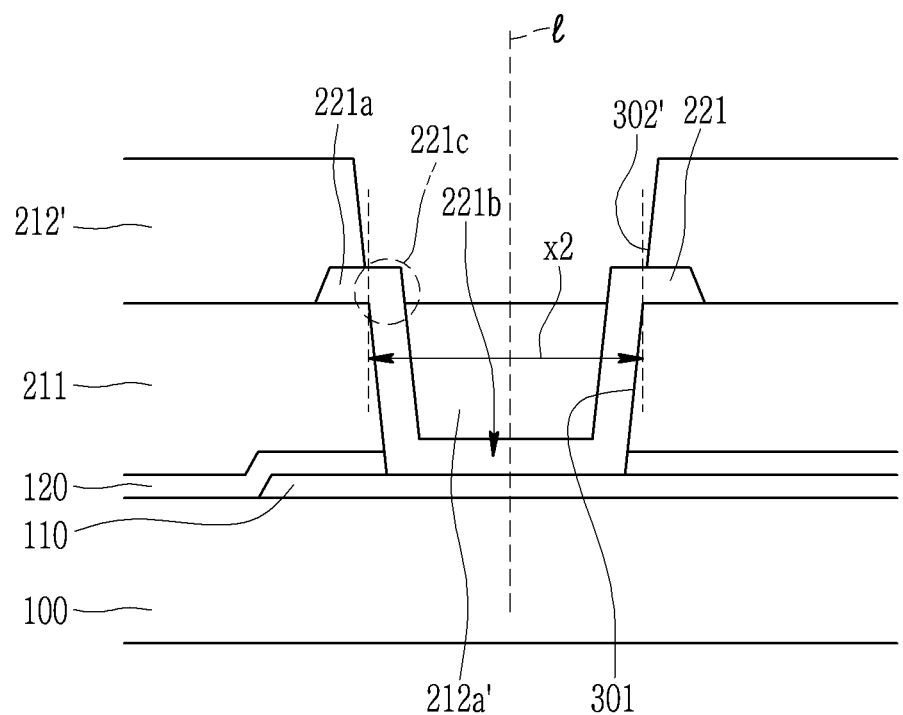

The second inorganic insulating film 212' is planarized to reduce the step, thus it is possible to prevent the inorganic insulating films 211 and 212' from being damaged in the process of forming the second opening 302' so as to expose the third portion 221c of the first conductive film 221 in FIG. 13.

Figure 12:
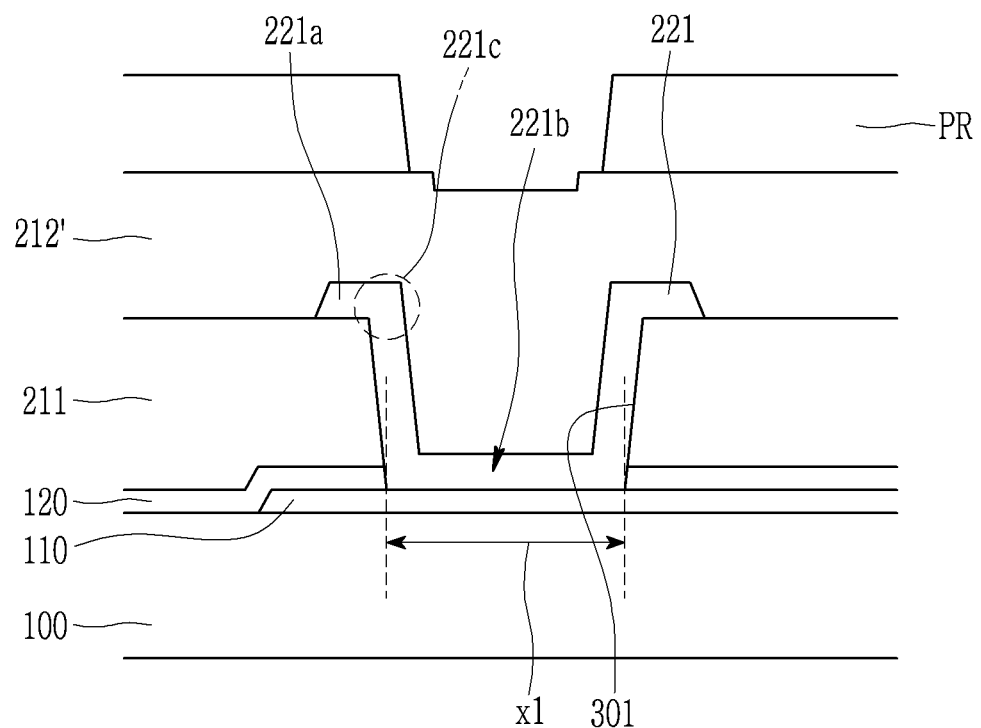

Referring to FIG. 12, a photoresist (PR) may be coated on the second inorganic insulating film 212'. The PR may be exposed and developed to form a PR pattern for a second opening 302'.

In this case, the photoresist PR may be positive in which the exposed portion is removed by a developer, or may be negative in which the unexposed portion is removed by the developer. Hereinafter, the positive photoresist will be exemplarily described.

Referring to FIG. 13, after the PR pattern is formed, the second opening 302' is formed by etching the second inorganic insulating film 212' exposed by the PR pattern so as to expose the third portion 223a of the first conductive film 221. The lower end portion of the second opening 302' may be narrower than the upper end portion thereof. In this case, in the process of forming the second opening 302', the second inorganic insulating film 212' including the filling portion 212a' is completed. The filling portion 212a' is a concave portion formed on the first conductive layer and is filled with the second inorganic insulating film 212'. As a result of formation of the second opening 302', the upper surface of the filling portion 212a' may coincide with the upper surface of the first inorganic insulating film 211. The filling portion 212a' is made of the same material as the second inorganic insulating film 212'.

In this case, when a width of the lower end portion of the second opening 302' in a sectional view is a second line width x2', the lower end portion of the second opening 302 may be formed so that the second line width x2' may be 1.5 μm or less. The second line width x2' may be greater than or equal to the first line width x1 of the first opening 301.

The center of the first line width x1 and the center of the second line width x2' may be formed on the straight line 1. That is, the upper and lower openings, which are the first and second openings 301 and 302' in the present embodiment, may be formed so as to exactly and vertically overlap each other.

Next, referring again to FIG. 9, the second conductive film 222' is formed on the lateral surfaces and the lower surface of the second opening 302' on the second inorganic insulating film 212'. The second conductive film 222' includes the fifth portion 222a' disposed on the upper portion of the second inorganic insulating film 212' and the sixth portion 222b' disposed on the lateral surface and the lower surface of the second opening 302'. The second conductive film 222' may be directly connected to the third portion 221c of the first conductive film 221 through the second opening 302' to be electrically connected to the semiconductor layer 110 in contact with the first conductive film 221.

On the other hand, by planarizing the upper surface of the second inorganic insulating film 212' by a planarization process, it is possible to facilitate the overlapping between the openings described above by reducing the interlayer step and to ensure the stability of the pattern of the subsequent layer and the stability of the light passing through the substrate 100.

Figure 14:
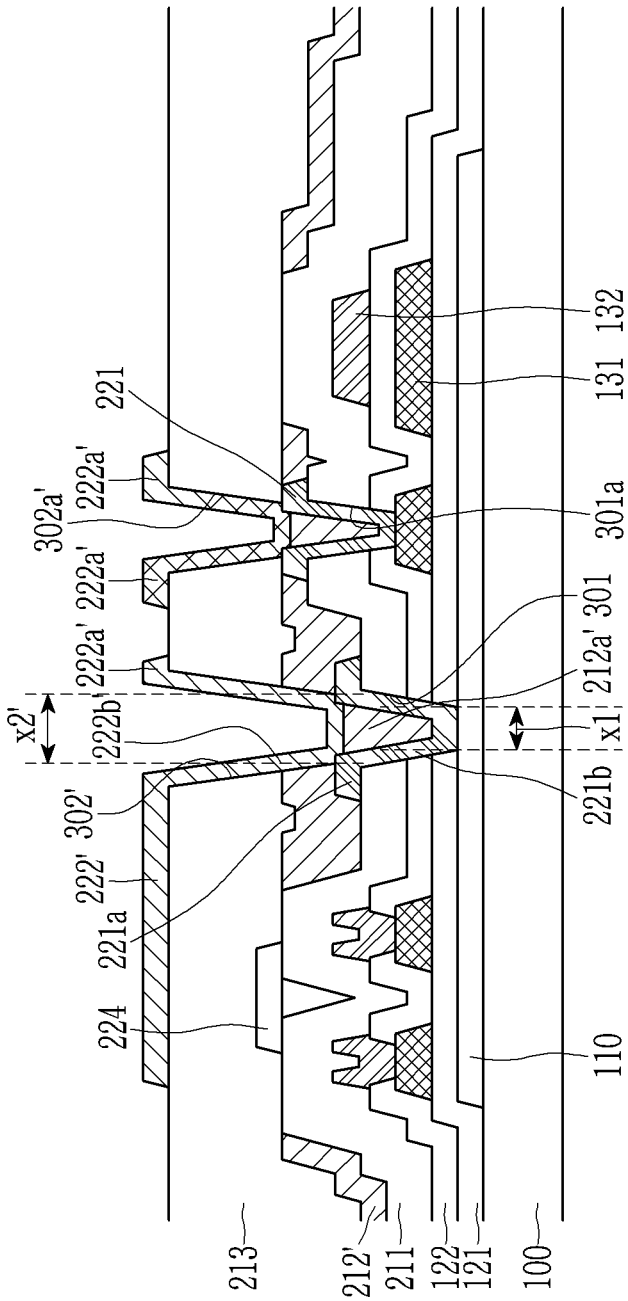

Hereinafter, a display device according to an embodiment will be described with reference to FIG. 14. FIG. 14 illustrates a cross-sectional view of the display device to which the embodiment of FIG. 9 is applied.

In the embodiment of FIG. 14, the opening overlap portion of FIG. 9 is applied instead of the opening overlap portion of FIG. 1 in the embodiment of FIG. 8, and thus features that are not described follow the embodiment described above, and elements and methods that are the same as the above-described embodiment will have the same reference numerals.

Referring to FIG. 14, a display device according to an embodiment includes the substrate 100, the first and second insulating films 121 and 122, the semiconductor layer 110, the first, second, and third inorganic insulating films 211, 212', and 213, the first and second conductive films 221 and 222', and the second storage electrode 224.

The second inorganic insulating film 212' may be disposed on the upper portion of the first inorganic insulating film 211 and the first conductive film 221. The second inorganic insulating film 212' may include the filling portion 212a' filling a concave portion on the first conductive film 221. The filling portion 212a' may be formed to fill the concave portion on the second portion 221b of the first conductive film 221.

In this case, the upper surface of the second inorganic insulating film 212' may be planarized through a planarization process so as to reduce the step.

The second storage electrode 224 may be disposed on the second inorganic insulating film 212'. A third inorganic insulating film 213 may be disposed on the second inorganic insulating film 212' on which the second storage electrodes 224 are disposed.

A second opening 302' is formed in the second inorganic insulating film 212' and the third inorganic insulating film 213 to expose a portion (the third portion 221c) of the first conductive film 221. Since the second opening 302' has the second line width x2' at the lower end portion, the second opening 302' may expose the first conductive film 221 by the second line width x2'. In this case, the second line width x2' may be less than or equal to 1.5 μm, and may be, for example, less than or equal to 1.3 μm.

In addition, the second opening 302' for exposing a portion of the first conductive film 221 is formed in the third inorganic insulating film 213.

In this case, the upper surface of the third inorganic insulating film 213 may be planarized through the planarization process, so that an interlayer step may be reduced.

The second conductive film 222' may be disposed on the planarized third inorganic insulating film 213. The second conductive film 222' may contact the first conductive film 221 through the second opening 302'. In this case, the second conductive film 222' may be formed on the lateral surface and the lower surface of the second opening 302'. The second conductive film 222' may include a fifth portion 222a' disposed on the upper portion of the third inorganic insulating film 213 and a sixth portion 222b' disposed on the lateral surface and the lower surface of the second opening 302'.

According to the present embodiment, the first opening 301 and the second opening 302' may vertically overlap. In this case, the first conductive film 221 and the second conductive film 222' are formed on the lateral surface and the lower surface of each of the first opening 301 and the second opening 302'. That is, the second conductive film 222' may be electrically connected to the semiconductor layer 110 or the first gate electrode 131 which is in contact with the first conductive film 221 by contacting the third portion 221c of the first conductive film 221 through the second opening 302'.

Although not shown, the display device according to the present embodiment may further include a passivation film, a partition wall, and an organic light emitting diode stacked on the second conductive film 222' described above.

Figure 15:
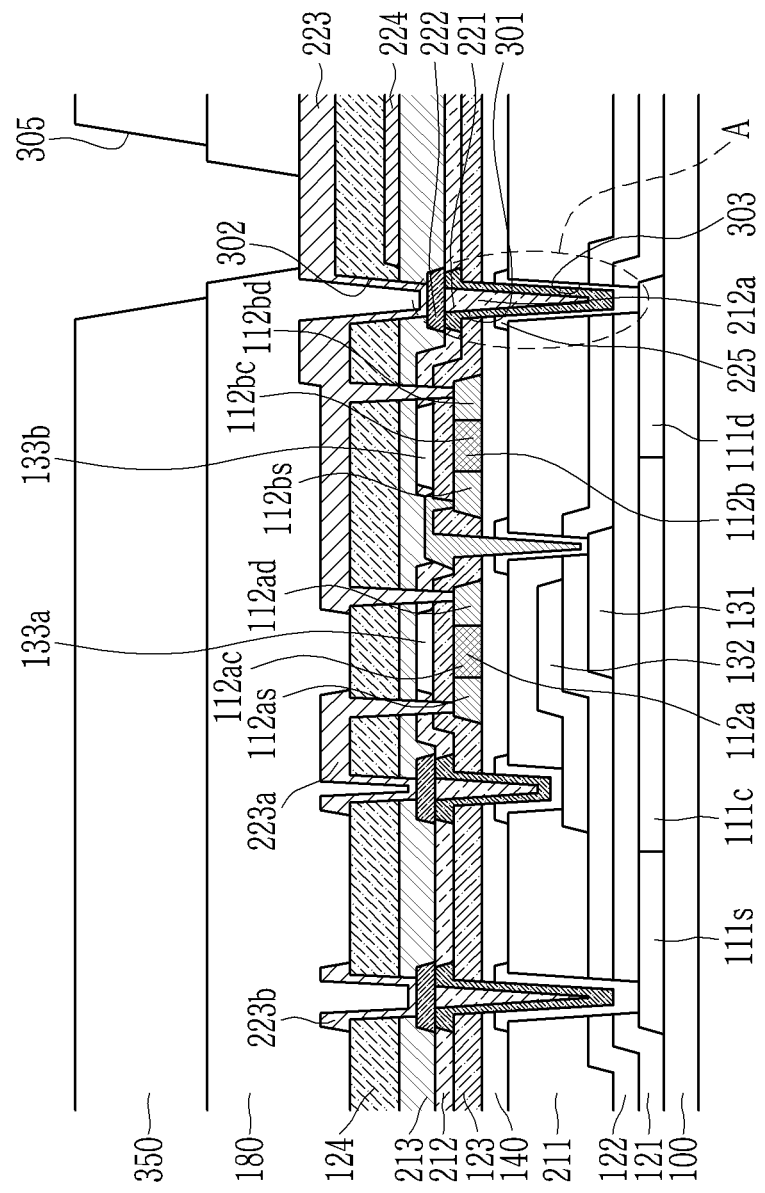
FIG. 15 illustrates a cross-sectional view of a display device according to an embodiment.
Figure 16:
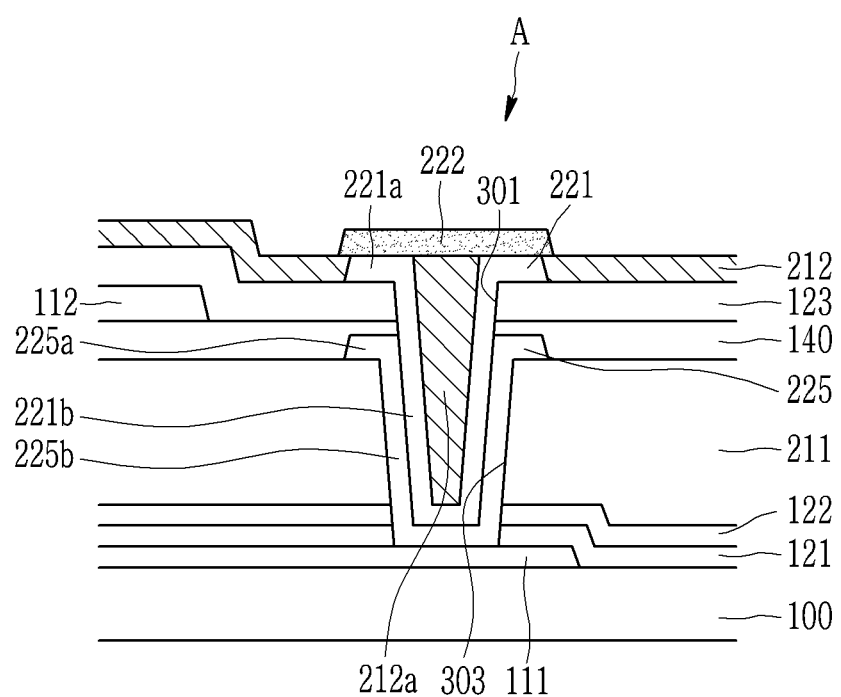
FIG. 16 illustrates an enlarged cross-sectional view of a portion of FIG. 15.

Hereinafter, a display device according to an embodiment will be described with reference to FIG. 15 and FIG. 16. FIG. 15 illustrates a cross-sectional view of a display device according to an embodiment, and FIG. 16 illustrates an enlarged cross-sectional view of a portion of FIG. 15.

FIG. 15 illustrates a cross-sectional view of the display device to which the embodiment of FIG. 1 is applied. The embodiment of FIG. 15 further includes second semiconductor layers 112a and 112b, second gate electrodes 133a and 133b, a fourth conductive film 225, a fourth gate insulating film 124, the passivation film 180, and the partition wall 350 as compared with FIG. 8.

Hereinafter, different features from those of FIG. 1 and FIG. 8 and the elements added to FIG. 1 and FIG. 8 will be mainly described. Elements that are not described follow the embodiments described above, and elements and methods that are the same as the above-described embodiments will have the same reference numerals.

Referring to FIG. 15, a display device according to an embodiment may include the substrate 100, the first to fourth gate insulating films 121, 122, 123, and 124, the first and second semiconductor layers 111 and 112, the first to third insulating films 211, 212, and 213, the first to fourth conductive films 221, 222, 223, and 225, the passivation film 180, and the partition wall 350.

The first semiconductor layer 111 is disposed on the insulating substrate 100. The first semiconductor layer 111 may include a channel region 111c, and a source region 111s and a drain region 111d with the channel region 111c therebetween. The first semiconductor layer 111 may be formed of a polycrystalline semiconductor, and a portion thereof may be doped to form the source region 111s and the drain region 111d which are conductive.

The first gate insulating film 121 may be disposed on the first semiconductor layer 111, and a gate line (not shown) including the first gate electrode 131 may extend in one direction on the first gate insulating film 121. The first gate electrode 131 overlaps the channel region 111c of the first semiconductor layer 111. The first semiconductor layer 111 and the first gate electrode 131 shown in FIG. 15 may form a driving transistor of a pixel. In FIG. 15, each of the source region 111s and the drain region 111d of the first semiconductor layer 111 has a structure that is connected to another layer through a deep contact hole. In addition, a terminal to which the driving transistor is connected may be variously changed according to embodiments.

The second gate insulating film 122 for protecting the first gate electrode 131 may be disposed on the first gate electrode 131. The storage electrode 132 may be disposed on the second gate insulating film 122. In this case, the storage electrode 132 may be formed with a step corresponding to stacking of a plurality of thin film layers. In the embodiment of FIG. 15, the storage electrode 132 may receive a voltage from the outside through a contact hole, and the voltage may be a driving voltage ELVDD.

The first inorganic insulating film 211 may be disposed on the storage electrode 132.

A plurality of openings may be formed in the first inorganic insulating film 211. The plurality of openings may include, for example, a third opening 303 penetrating the first gate insulating film 121, the second gate insulating film 122, and the first inorganic insulating film 211 and exposing a portion of the first semiconductor layer 111. Further, it may further include an opening penetrating the second gate insulating film 122 and the first inorganic insulating film 211 and exposing a portion of the first gate electrode 131, or an opening penetrating only the first inorganic insulating film 211 and exposing a portion of the storage electrode 132.

The fourth conductive film 225 may be disposed on the upper portion of the first inorganic insulating film 211. The fourth conductive film 225 may be formed on the lateral surface and the lower surface of the third opening 303. The fourth conductive film 225 may be formed to be wider than the third opening 303, and may include a portion disposed on the upper portion of the first inorganic insulating film 211 and a portion disposed on the lateral surface and a lower surface of the third opening 303.

A buffer layer 140 may be disposed on the upper portion of the first inorganic insulating film 211 and the fourth conductive film 225. A second semiconductor layer 112 is disposed on the buffer layer 140.

In FIG. 15, the second semiconductor layer 112 is divided into two portions, and the two portions are a second semiconductor layer 112a for a second transistor and a second semiconductor layer 112b for a third transistor. The second semiconductor layer 112b for the second transistor includes a channel region 112ac, a source region 112as, and a drain region 112ad of the second transistor, and the second semiconductor layer 112b for the third transistor includes a channel region 112bc, a source region 112bs, and a drain region 112bd of the third transistor.

The third gate insulating film 123 may be disposed on the second semiconductor layer 112. A plurality of openings may be formed in the third gate insulating film 123. The plurality of openings may include, for example, a first opening 301 penetrating the third gate insulating film 123 and the buffer layer 140 and contacting the fourth conductive film 225.

The first conductive film 221 and the second gate electrode 133 may be disposed on the third gate insulating film 123.

The first conductive film 221 may be formed on the lateral surface and the lower surface of the first opening 301. The first conductive film 221 may include a portion disposed on the upper portion of the third gate insulating film 123 and a portion disposed on the lateral surface and the lower surface of the first opening 301.

The second gate electrode 133 includes the second gate electrode 133a for the second transistor and the second gate electrode 133b for the third transistor. The second gate electrode 133a for the second transistor and the second semiconductor layer 112a for the second transistor form the second transistor, and the second gate electrode 133b for the third transistor and the second semiconductor layer 112b for the third transistor form the third transistor.

The second inorganic insulating film 212 may be disposed on the third gate insulating film 123, the first conductive film 221, and the second gate electrode 133. In this case, the upper surface of the second inorganic insulating film 212 may be planarized through a planarization process so as to coincide with the upper surface of the first conductive film 221 and the upper surface of the second gate electrode 133.

The second inorganic insulating film 212 is also formed on the first conductive film 221 when the second inorganic insulating film 212 is stacked, and the portion in which the second inorganic insulating film 212 is formed on the first conductive film 221 remains in the planarization process to form a filling portion 212a filling a concave portion formed on the first conductive film 221.

The second conductive film 222 may be disposed on the first conductive film 221. The second conductive film 222 is formed to cover the filling portion 212a of the second inorganic insulating film 212 and a portion of the first conductive film 221, and has a structure that may easily contact the first conductive film 221 and other layers. In this case, the second conductive film 222 is formed with a filling portion 212a at a lower portion thereof, thus it is formed to be flat without a step, unlike the first conductive film 221. Accordingly, it is possible to provide a structure in which the second opening 302 with a fine size may be easily overlapped on the first opening 301, thereby realizing the resolution limit in the high-resolution display device.

The third inorganic insulating film 213 may be disposed on the second inorganic insulating film 212, the second conductive film 222, and the second gate electrode 133. The second storage electrode 224 may be disposed on the third inorganic insulating film 213. The second storage electrode 224 may serve to constantly maintain the voltage of one electrode of the organic light emitting diode constant.

The fourth gate insulating film 124 may be disposed on the third inorganic insulating film 213 and the second storage electrode 224.

The third inorganic insulating film 213 and the fourth gate insulating film 124 may be planarized through a planarization process to reduce the interlayer step.

A plurality of openings may be formed in the fourth gate insulating film 124. The plurality of openings may include, for example, the second opening 302 penetrating the third inorganic insulating film 213 and the fourth gate insulating film 124 and exposing a portion of the second conductive film 222. Alternatively, it may include an opening penetrating the third gate insulating film 123, the second inorganic insulating film 212, the third inorganic insulating film 213, and the fourth gate insulating film 124 and exposing a portion of the second semiconductor layer 112.

The third conductive films 223, 223a, and 223b may be disposed on the planarized fourth gate insulating film 124. The third conductive film 223 may contact the second conductive film 222 through the second opening 302, and may contact the second semiconductor layer 112a of the second transistor or the second semiconductor layer 112b of the third transistor through another opening. The third conductive film 223a may contact the second conductive film 222 through the second opening 302, and may contact the second semiconductor layer 112a of the second transistor through another opening. The third conductive film 223b may contact the second conductive film 222 through the second opening 302.

In this case, the third conductive film 223 may be formed on the lateral surface and the lower surface of the second opening 302. The third conductive films 223, 223a, and 223b may include a portion disposed on the upper portion of the fourth gate insulating film 124, and a portion disposed on the lateral surface and the lower surface of the second opening 302 or a portion formed to fill the second opening 302.

The passivation film 180 may be disposed on the fourth gate insulating film 124 and the third conductive films 223, 223a, and 223b. The passivation film 180 may include an inorganic insulating material such as a silicon nitride (SiNx) or a silicon oxide (SiOx), or an organic material. The partition wall 350 may be disposed on the passivation film 180. The partition wall 350 forms an area in which one organic light emitting layer (not shown) may be formed, and an organic light emitting element (not shown) may be disposed in the partition wall 350.

Next, a pixel opening 305 may be formed by patterning the passivation layer 180 and the partition wall 350 by an etching process using a pattern mask.

According to the present embodiment, the first opening 301 and the second opening 302 may vertically overlap each other with the second conductive film 222 disposed therebetween. In this case, the first conductive film 221 and the third conductive films 223, 223a, and 223b are formed on the lateral surface and the lower surface of each of the first opening 301 and the second opening 302. That is, the third conductive films 223, 223a, and 223b may be electrically connected to the layer that is in contact with the first conductive film 221 through the second conductive film 222.

The first to third transistors described above have a top gate structure in which the gate electrodes 131 and 133 are disposed on the semiconductor layers 111 and 112, but the present inventive concept is not limited thereto, and may have various structures such as a bottom gate structure in which the gate electrodes 131 and 133 are disposed under the semiconductor layers 111 and 112, and the like.

In the display device according to the embodiment of FIG. 15, the first semiconductor layer 111 and the second semiconductor layer 112 are disposed on different planes. Accordingly, by vertically overlapping different transistors, the area occupied by one pixel may be reduced to realize the high resolution. In this case, the opening overlap portion according to the above-described embodiment may be applied for electrical connection between the vertically overlapped layers.

According to the above-described embodiment, in the display device in which the fine size openings are vertically overlapped, it is possible to secure the target line widths x2 and x2' for realizing the resolution limit of the opening at the upper portion by filling the concave portion on the conductive film with the inorganic insulating film. In other words, as the inside of the lower opening becomes flat due to the filling portions 212a and 212a' of the inorganic insulating film, it is possible to form the upper opening by overlapping the opening of the fine size like the lower opening.

In addition, the planarization process may be easily performed by forming an insulating film with an inorganic film of which height may be easily controlled in processes such as deposition and etching. Through the planarization process, the interlayer step may be reduced to decrease process scattering, stability in pattern formation of the subsequent layer may be improved, and the interlayer straightness may be improved by eliminating steps in the lower layer.

Hereinafter, a display device according to an embodiment will be described with reference to FIG. 16. FIG. 16 illustrates an enlarged cross-sectional view of the overlapped portion A of the lower third opening 303 and the upper first opening 301 among the three openings of FIG. 15.

Referring to FIG. 16, a display device according to an embodiment includes the substrate 100, the first semiconductor layer 111, the first to third gate insulating films 121, 122, and 123, the first and second inorganic insulating films 211 and 212, the first, second, and fourth conductive films 221, 222, and 225, and the buffer layer 140.

The first semiconductor layer 111 may be disposed on the insulating substrate 100. The first gate insulating film 121, the second gate insulating film 122, and the first inorganic insulating film 211 may be sequentially disposed on the first semiconductor layer 111.

The third opening 303 is formed in the first gate insulating film 121, the second gate insulating film 122, and the first inorganic insulating film 211 to expose a portion of the first semiconductor layer 111. The lower end portion of the third opening 303 may be narrower than the upper end portion thereof.

The fourth conductive film 225 may be disposed on the upper portion of the first inorganic insulating film 211. The fourth conductive film 225 may be in contact with the first semiconductor layer 111 through the third opening 303. The fourth conductive film 225 may be a component of a circuit for transmitting a signal for driving a pixel of the display device according to the embodiment, and may be, for example, a data line or a data electrode for transmitting a data signal.

In this case, the fourth conductive film 225 may be formed on the lateral surface and the lower surface of the third opening 303. The fourth conductive film 225 may include a seventh portion 225a disposed on the upper portion of the first inorganic insulating film 211 and an eighth portion 225b disposed on the lateral surface and the lower surface of the third opening 303.

The buffer layer 140 may be disposed on the upper portion of the first inorganic insulating film 211 on which the seventh portion 225a of the fourth conductive film 225 is formed. The second semiconductor layer 112 may be disposed on the buffer layer 140, and the third gate insulating film 123 may be disposed thereon.

In this case, the first opening 301 overlapping the lower third opening 303 may be formed in the first inorganic insulating film 211, the buffer layer 140, and the third gate insulating film 123. The lower end portion of the first opening 301 may be narrower than the upper end portion thereof. The width of the lower end portion of the first opening 301 may be smaller than the width of the lower end portion of the third opening 303. Thus, as shown in FIG. 16, the first opening 301 may be disposed inside the third opening 303.

The first conductive film 221 may be disposed on the third gate insulating film 123. The first conductive film 221 may be in contact with the fourth conductive film 225 in contact with the first semiconductor layer 111 through the first opening 301. In this case, the first conductive film 221 may be formed on a lateral surface and a lower surface of the first opening 301. The first conductive film 221 may include a first portion 221a disposed on the upper portion of the first inorganic insulating film 211 and a second portion 221b disposed on the lateral surface and the lower surface of the first opening 301.

The second inorganic insulating film 212 may be disposed on the upper portion of the third gate insulating film 123 and the first conductive film 221. The second inorganic insulating film 212 may include a filling portion 212a filling a concave portion on the first conductive film 221. The filling portion 212a may be formed to fill the concave portion on the first conductive film 221. In this case, the upper surface of the second inorganic insulating film 212 may be planarized through a planarization process so as to coincide with the upper surface of the first portion 221a of the first conductive film 221.

The second conductive film 222 may be disposed on the second inorganic insulating film 212 and the first portion 221a of the first conductive film 221. The second conductive film 222 may be formed to cover the filling portion of the second inorganic insulating film 212 and the first portion 221a of the first conductive film 221.

While this inventive concept has been described in connection with what is presently considered to be practical exemplary embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
a substrate;
a semiconductor layer disposed on the substrate;
a first inorganic insulating film disposed on the semiconductor layer and including a first opening;
a first conductive film disposed on the first inorganic insulating film, the first conductive film disposed on a lateral surface and a lower surface of the first opening;
a second inorganic insulating film disposed on the first inorganic insulating film, the second inorganic insulating film filling a concave portion on the first conductive film;
a second conductive film disposed on the second inorganic insulating film and connected to the first conductive film;
a third inorganic insulating film disposed on the second conductive film and the second inorganic insulating film exposed by the second conductive film, the third inorganic insulating film including a second opening; and
a third conductive film disposed on the third inorganic insulating film and connected to the second conductive film,
wherein the first opening and the second opening overlap each other in a plan view.

2. The display device of claim 1, wherein
a lower end portion of each of the first opening and the second opening is narrower than an upper end portion thereof, and
when a width of the lower end portion of the first opening is referred to as a first line width and a width of the lower end portion of the second opening is referred to as a second line width, the second line width is larger than or equal to the first line width.

3. The display device of claim 2, wherein
the first line width is 1.3 um or less.

4. The display device of claim 2, wherein
the first opening and the second opening overlap so that a center of the first line width, a center of the second conductive film, and a center of the second line width are in a straight line.

5. The display device of claim 1, wherein
the second inorganic insulating film is planarized so that an upper surface of the second inorganic insulating film coincides with an upper surface of the first conductive film formed on the second inorganic insulating film.

6. The display device of claim 1, wherein
the second conductive film and the third conductive film are in contact with each other in a predetermined area within a closed edge.

7. A display device comprising:
a substrate;
a semiconductor layer disposed on the substrate;
a first inorganic insulating film disposed on the semiconductor layer and including a first opening;
a first conductive film disposed on the first inorganic insulating layer, the first conductive film disposed on a lateral surface and a lower surface of the first opening;
a second inorganic insulating film disposed on the first conductive film, the second inorganic insulating film filling a concave portion on the first conductive film, the second inorganic insulating film including a second opening; and
a second conductive film disposed on the second inorganic insulating film, formed on a lateral surface and a lower surface of the second opening, and connected to the first conductive film,
wherein the first opening and the second opening overlap each other in a plan view.

8. The display device of claim 7, wherein
a lower end portion of each of the first opening and the second opening is narrower than an upper end portion thereof, and
when a width of the lower end portion of the first opening is referred to as a first line width and a width of the lower end portion of the second opening is referred to as a second line width, the second line width is larger than or equal to the first line width.

9. The display device of claim 8, wherein
the first line width is 1.3 um or less.

10. The display device of claim 8, wherein
the first opening and the second opening overlap so that a center of the first line width and a center of the second line width are in a straight line.

11. The display device of claim 7, wherein
a contact region of the first conductive film and the second conductive film has a ring shape in a plan view.

12. A manufacturing method of a display device, comprising:
forming a semiconductor layer on a substrate;
forming an insulating film on the substrate;
forming a first inorganic insulating film on the insulating film;
forming a first opening exposing the semiconductor layer in the first inorganic insulating film;
forming a first conductive film on a lateral surface and a lower surface of the first opening on the first inorganic insulating film;
forming a second inorganic insulating film on the first inorganic insulating film and a concave portion formed on the first conductive film;
planarizing the second inorganic insulating film to form an isolated filling portion which fills the concave portion on the first conductive film;
forming a second conductive film on the planarized second inorganic insulating film;
forming a third inorganic insulating film on the second conductive film and the second inorganic insulating film exposed by the second conductive film;
forming a second opening that exposes the second conductive film in the third inorganic insulating film at a position overlapping the first opening in a plan view; and
forming a third conductive film that is disposed on the third inorganic insulating film and is disposed on a lateral surface and a lower surface of the second opening.

13. The manufacturing method of the display device of claim 12, wherein
in the planarizing of the second inorganic insulating film, an upper surface of the second inorganic insulating film is planarized so that the upper surface of the second inorganic insulating film coincides with an upper surface of the first conductive film formed on the first inorganic insulating film.

14. The manufacturing method of the display device of claim 12, wherein
a lower end portion of each of the first opening and the second opening is narrower than an upper end portion thereof, and
when a width of the lower end portion of the first opening is referred to as a first line width and a width of the lower end portion of the second opening is referred to as a second line width, the second line width is larger than or equal to the first line width.

15. The manufacturing method of the display device of claim 14, wherein
the first line width is 1.3 urn or less.

16. The manufacturing method of the display device of claim 14, wherein
the first opening and the second opening overlap so that a center of the first line width, a center of the second conductive film, and a center of the second line width are in a straight line.

17. A manufacturing method of a display device, comprising:
forming a semiconductor layer on a substrate;
forming an insulating film on the substrate;
forming a first inorganic insulating film on the insulating film;
forming a first opening exposing the semiconductor layer in the first inorganic insulating film;
forming a first conductive film on a lateral surface and a lower surface of the first opening on the first inorganic insulating film;
forming a second inorganic insulating film on the first conductive film, on the first inorganic insulating film exposed by the first conductive film, and on the first conductive film to fill a concave portion formed on the first conductive film;
partially planarizing an upper surface of the second inorganic insulating film;
forming a second opening that exposes the first conductive film and the second inorganic insulating film filling the concave portion formed on the first conductive film to overlap the first opening in a plan view; and
forming a second conductive film that is disposed on the second inorganic insulating film and is disposed on a lateral surface and a lower surface of the second opening.

18. The manufacturing method of the display device of claim 17, wherein
in the planarizing the upper surface of the second inorganic insulating film, an upper surface of the second inorganic insulating film is planarized so that the upper surface of the second inorganic insulating film is higher than an upper surface of the first conductive film formed on the first inorganic insulating film.

19. The manufacturing method of the display device of claim 17, wherein a lower end portion of each of the first opening and the second opening is narrower than an upper end portion thereof, and when a width of the lower end portion of the first opening is referred to as a first line width and a width of the lower end portion of the second opening is referred to as a second line width, the second line width is larger than and equal to the first line width.

20. The manufacturing method of the display device of claim 19, wherein the first line width is 1.3 um or less.

* * * * *